United States Patent
Hill

(10) Patent No.: US 7,534,290 B2
(45) Date of Patent: May 19, 2009

(54) CORROSION RESISTANT THERMAL BARRIER COATING MATERIAL

(75) Inventor: Michael Hill, Frederick, MD (US)

(73) Assignee: Skyworks Solutions, Inc., Irvine, CA (US)

( * ) Notice: Subject to any disclaimer, the term of this patent is extended or adjusted under 35 U.S.C. 154(b) by 365 days.

(21) Appl. No.: 11/657,855

(22) Filed: Jan. 24, 2007

(65) Prior Publication Data
US 2007/0277698 A1    Dec. 6, 2007

Related U.S. Application Data

(60) Provisional application No. 60/811,543, filed on Jun. 6, 2006.

(51) Int. Cl.
*C09B 9/02* (2006.01)
(52) U.S. Cl. .................................... 106/14.05
(58) Field of Classification Search ............... 106/14.05
See application file for complete search history.

(56) References Cited

U.S. PATENT DOCUMENTS

| 5,288,205 A | 2/1994 | Jones |
| 6,096,381 A | 8/2000 | Zheng |
| 6,730,422 B2 * | 5/2004 | Litton et al. ................ 428/701 |
| 2004/0175597 A1 | 9/2004 | Litton |

* cited by examiner

*Primary Examiner*—Melvin C Mayes
*Assistant Examiner*—Michael Forrest
(74) *Attorney, Agent, or Firm*—Lowrie, Lando & Anastasi, LLP

(57) ABSTRACT

According to one exemplary embodiment, a method for forming a corrosion resistant thermal barrier coating material includes steps of blending indium oxide with at least one hydrate forming oxide to form a mechanical mixture, heating the mechanical mixture to a sufficiently high temperature to form an indate precursor, and blending the indate precursor with at least one non-hydrate forming oxide to form a co-stabilized mixture. In one embodiment, the co-stabilized mixture can be changed into an APS powder by using a powder forming method. In another embodiment, the co-stabilized mixture can be formed into a desired shape and heated to form an EB-PVD ingot.

18 Claims, 2 Drawing Sheets

CORROSION RESISTANT THERMAL BARRIER COATING MATERIAL

The present application claims the benefit of and priority to a pending provisional patent application entitled "Corrosion Resistant Thermal Barrier Coating Material," Ser. No. 60/811,543 filed on Jun. 6, 2006. The disclosure in that pending provisional application is hereby incorporated fully by reference into the present application.

BACKGROUND OF THE INVENTION

1. Field of the Invention

The present invention generally relates to the field of thermal barrier coating materials. More particularly, the invention relates to the field of corrosion resistant thermal barrier coating materials.

2. Background Art

Metallic components that operate at high temperatures, such as industrial gas turbines or aero-engine parts, often utilize a thermal barrier coating to keep metal temperatures low and prolong the life of the component. Insulating thermal barrier coatings allow the metallic components to operate at higher temperatures, which improves efficiency. At high temperatures, stabilized zirconia has a tetragonal or cubic crystal structure with a very low thermal conductivity, which makes it ideal for high temperature thermal barrier coating applications. However, when zirconia cools from these high temperatures, it transforms from a cubic to a tetragonal to a monoclinic crystal structure, causing a volume expansion that induces high stress and affects the integrity of the coating. Conventional thermal barrier coating solutions have focused on stabilizing the cubic phase of zirconia.

Moreover, impurities in fuels, such as sodium, sulfur, phosphorus, and especially vanadium, can corrode a thermal barrier coating and cause spalling of the coating off the metallic component. This is especially prevalent in industrial gas turbine applications, which do not use fuel as "clean" as that used for aero-engines. Corrosion of the thermal barrier coating exposes both the thermal barrier coating and the metallic component underneath to not only to the corrosive fuel impurities but also to high temperatures, drastically reducing the lifetime and efficiency of the metallic components and the thermal barrier coating.

Prior efforts to stabilize the cubic phase of zirconia while making the coating chemically resistant to the corrosives found in many fuels has proven difficult. One conventional method utilizes scandia stabilized zirconia as a thermal barrier coating, which results in an effective thermal barrier coating with high resistance to corrosives. However, scandia is extremely expensive, making this method impractical for widespread use. Another conventional method attempts to utilize indium stabilized zirconia as a thermal barrier coating. However, indium is so volatile that the indium in an indium stabilized zirconia material boils off during plasma spraying or electron beam physical deposition and does not remain in the thermal barrier coating. Thus there is a need in the art for a cost effective corrosive resistant thermal barrier coating material for use in high temperature applications without the shortcomings of conventional corrosive resistant thermal barrier coating materials.

SUMMARY OF THE INVENTION

A corrosion resistant thermal barrier coating material, substantially as shown in and/or described in connection with at least one of the figures, and as set forth more completely in the claims.

DETAILED DESCRIPTION OF THE INVENTION

The present invention is directed to a corrosion resistant thermal barrier coating material. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
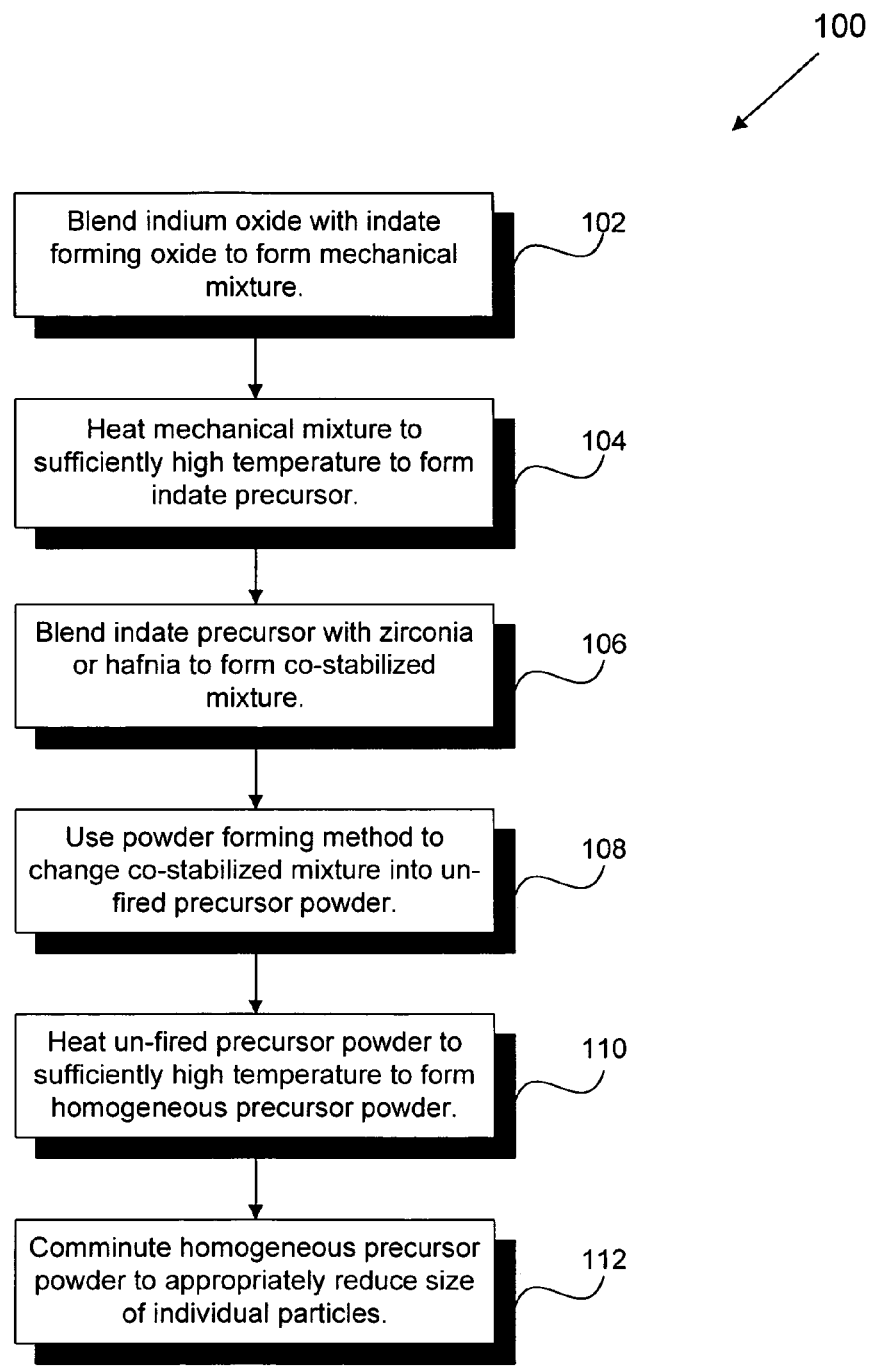
FIG. 1 is a flowchart illustrating steps taken to implement one embodiment of the present invention.

FIG. 1 shows flowchart 100 illustrating an exemplary method for forming an air plasma sprayable ("APS") powder for use as a corrosion resistant thermal barrier coating material, in accordance with one embodiment of the present invention. Certain details and features have been left out of flowchart 100 that are apparent to a person of ordinary skill in the art. For example, a step may consist of one or more sub-steps or may involve specialized equipment or materials, as known in the art. While flowchart 100 is sufficient to illustrate one exemplary embodiment of the present invention, other embodiments of the invention may utilize steps that are different than those specifically shown and discussed in relation to flowchart 100.

At step 102 of flowchart 100, indium oxide ("$In_2O_3$") is blended with one or more indate forming oxides to form a mechanical mixture. The mechanical mixture comprises a mixture of particles of one or more of the individual indate forming oxides and particles of indium oxide. In the mechanical mixture, the particles of the one or more indate forming oxides and the particles of indium oxide remain distinct. The indate forming oxides can be selected from the lanthanide oxide group (generally referred to as "$Ln_2O_3$"), including lanthanum oxide ("$La_2O_3$"), cerium oxide ("$Ce_2O_3$"), praseodymium oxide ("$Pr_2O_3$"), neodymium oxide ("$Nd_2O_3$"), promethium oxide ("$Pm_2O_3$"), samarium oxide ("$Sm_2O_3$"), europium oxide ("$Eu_2O_3$"), gadolinium oxide ("$Gd_2O_3$"), terbium oxide ("$Tb_2O_3$"), dysprosium oxide ("$Dy_2O_3$"), holmium oxide ("$Ho_2O_3$"), erbium oxide ("$Er_2O_3$"), thulium oxide ("$Tm_2O_3$"), ytterbium oxide ("$Yb_2O_3$"), and lutetium oxide ("$Lu_2O_3$"), the alkaline earth oxide group, including magnesium oxide ("MgO") and calcium oxide ("CaO"), and the rare earth oxide group, including yttrium oxide ("$Y_2O_3$").

The indate forming oxides and the indium oxide can be blended to form the mechanical mixture. For example, blending indium oxide with any lanthanide oxide, $Ln_2O_3$, and applying an appropriate heat treatment will result in the compound $LnInO_3$. As other examples, reacting indium oxide with magnesium oxide, MgO, results in $Mg_2InO_4$, and reacting indium oxide with calcium oxide, CaO, results in $Ca_2InO_4$. Also, a combination of magnesium oxide and calcium oxide can also be reacting with indium oxide to form a compound generalized as "$(Mg,Ca)_2InO_4$". As another example, blending indium oxide with $La_2O_3$, results in $LaInO_3$. After blending, the mechanical mixture is dried. The drying method can include, for example, pan drying, spray drying, or other appropriate drying methods.

At step 104 of flowchart 100, the mechanical mixture formed in step 102 of flowchart 100 is heated to a sufficiently high temperature to form an indate precursor, for example, $LnInO_3$, $Ca_2InO_4$ or $Mg_2InO_4$. Heating can be a high temperature solid state reaction, such as calcination. For example, calcination can occur at temperatures between approximately 1150° C. and 1400° C. In the calcination process, heating the mechanical mixture to a sufficiently high temperature forms an indate precursor, which can have a perovskite structure, a hexagonal structure, or other appropriate crystal structures. However, the particular crystal structure that is formed depends on which indate forming oxide is reacted with the indium oxide. For example, reacting indium oxide with lanthanum, cerium, praseodymium, neodymium, or samarium in step 102 of flowchart 100 will form a perovskite indate precursor, but reacting indium oxide with the lanthanides of gadolinium or dysprosium will form a hexagonal indate precursor.

At step 106 of flowchart 100, the indate precursor formed at step 104 of flowchart 100 is blended with zirconia ("$ZrO_2$"), hafnia ("$HfO_2$") or a blend of zirconia and hafnia. The blending method, for example, can include Cowles blending, ball milling, vibratory milling, and other appropriate blending methods. Blending the indate precursor with zirconia or hafnia results in a slurry, which can be dried using a drying method. The drying method, for example, can include pan drying, spray drying, and other appropriate drying methods. After drying, the resulting co-stabilized mixture is a combination of the indate precursor and zirconia, hafnia or a mixture of zirconia and hafnia.

The chemical composition of the co-stabilized mixture is $Zr_{1-x-y}In_xM_yO_z$, where "Zr" can be zirconia, hafnia, or a blend of zirconia and hafnia (generalized as "$(Zr,Hf)O_2$"), and "M" can be calcia, magnesia, yttria, lanthanum oxide, cerium oxide, praseodymium oxide, neodymium oxide, promethium oxide, samarium oxide, europium oxide, gadolinium oxide, terbium oxide, dysprosium oxide, holmium oxide, erbium oxide, thulium oxide, ytterbium oxide, or lutetium oxide. Furthermore, "x" and "y" can each have values ranging from approximately 0.01 to approximately 0.20, and z can have a value ranging from approximately 1.6 to approximately 2.4.

At step 108 of flowchart 100, the mixture formed at step 106 of flowchart 100 is changed into an un-fired precursor powder by using a powder forming method. The powder forming method can include spray drying and sieving, pelletizing and sieving, or other appropriate powder forming methods. At step 110 of flowchart 100, the un-fired precursor powder of step 108 of flowchart 100 is heated to a sufficiently high temperature (i.e. sintered) to form a homogeneous precursor powder. In the sinter process, heating the un-fired precursor powder to a sufficiently high temperature causes the un-fired precursor powder to chemically react to form a homogeneous precursor powder. For example, sintering can occur at temperatures between approximately 1150° C. and 1650° C. The sintering process enables the chemical reaction and gives mechanical strength to the homogeneous precursor powder.

At step 112 of flowchart 100, the reacted homogeneous precursor powder of step 110 of flowchart 100 is comminuted to form a homogeneous precursor powder having a desired particle size. For example, during the comminution process, the homogeneous precursor powder can be crushed and vibratory milled to appropriately reduce the size of the individual particles in the homogeneous precursor powder.

Figure 2:
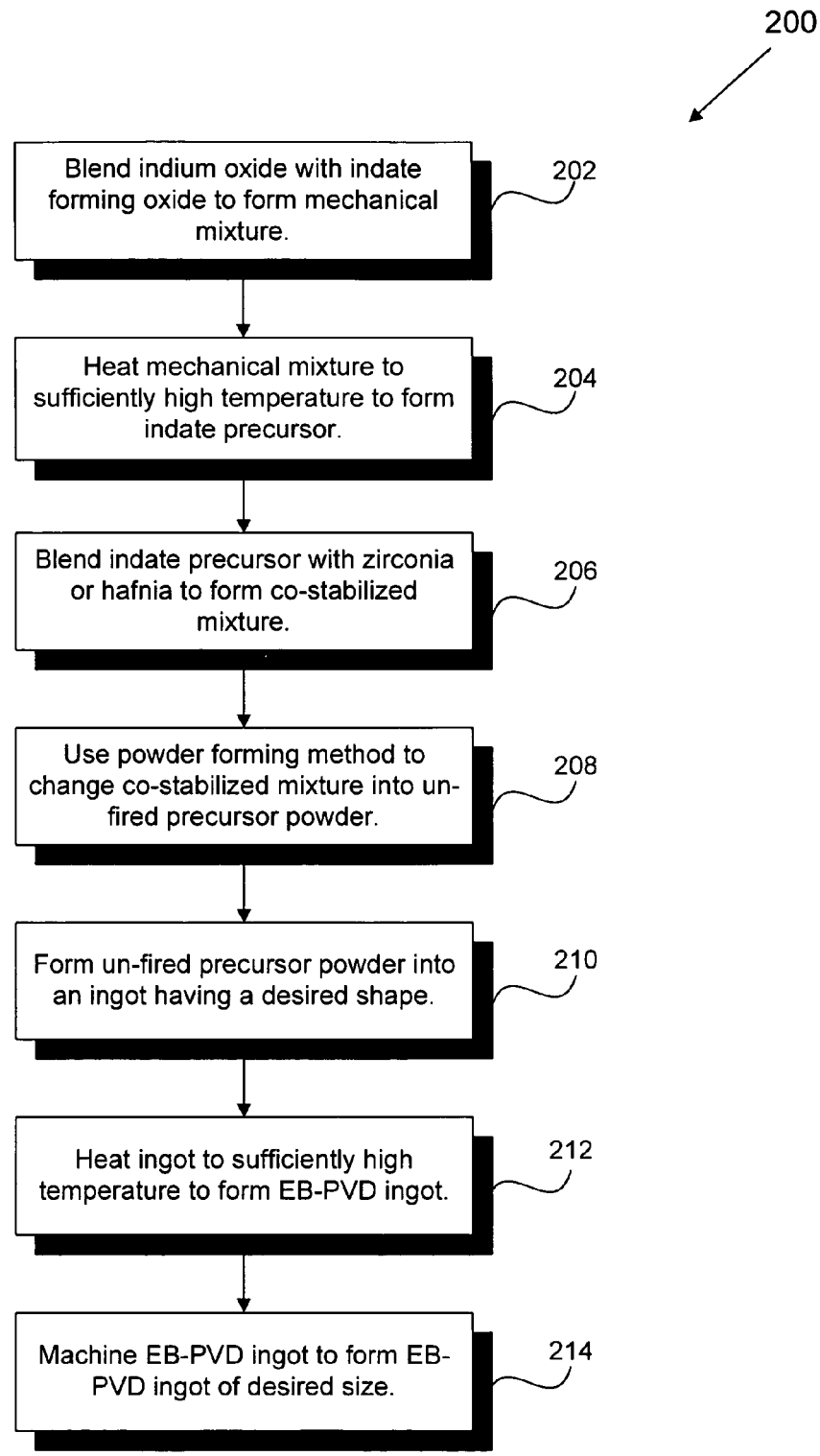
FIG. 2 is a flowchart illustrating steps taken to implement one embodiment of the present invention.

FIG. 2 shows flowchart 200 illustrating an exemplary method for forming an electron beam physical vapor deposition ("EB-PVD") ingot for use as a corrosion resistant thermal barrier coating material, in accordance with another embodiment of the present invention. Certain details and features have been left out of flowchart 200 that are apparent to a person of ordinary skill in the art. For example, a step may consist of one or more sub-steps or may involve specialized equipment or materials, as known in the art. While flowchart 200 is sufficient to illustrate one exemplary embodiment of the present invention, other embodiments of the invention may utilize steps that are different than those specifically shown and discussed in relation to flowchart 200.

In FIG. 2, steps 202, 204, 206 and 208 of flowchart 200 correspond, respectively, to steps 102, 104, 106 and 108 of flowchart 100 in FIG. 1. At step 202 of flowchart 200, indium oxide is blended with one or more indate forming oxides to form a mechanical mixture. At step 204 of flowchart 200, the mechanical mixture formed in step 202 of flowchart 200 is subjected to a high temperature heat treatment to form an indate precursor. At step 206 of flowchart 200, the indate precursor formed at step 204 of flowchart 200 is blended with either zirconia or hafnia, resulting in a co-stabilized mixture. At step 208 of flowchart 200, the co-stabilized mixture formed at step 206 of flowchart 200 is changed into an un-fired precursor powder by using a powder forming method. It is understood that the detailed description, alternative methods, materials, elements, and examples provided above with respect to steps 102, 104, 106 and 108 of flowchart 100 apply equally to the detailed description, alternative methods, materials, elements, and examples for the corresponding steps 202, 204, 206 and 208 of flowchart 200, and are not repeated here to preserve brevity.

At step 210 of flowchart 200, the un-fired precursor powder of step 208 of flowchart 200 is formed into an ingot having a desired shape. For example, the un-fired precursor powder can be formed into an ingot having a desired shape by pressing the un-fired precursor powder into the desired shape, such as a rectangular shape, a tubular shape, or another appropriate shape. At step 212 of flowchart 200, the ingot of step 210 of flowchart 200 is heated to a sufficiently high temperature (i.e. sintered) to form an EB-PVD ingot. In the sinter process, heating the ingot to a sufficiently high temperature causes the packed powder to form an EB-PVD ingot. For example, sintering can occur at temperatures between approximately 1150° C. and 1650° C. Sintering gives mechanical strength to the EB-PVD ingot. At step 214 of flowchart 200, the EB-PVD ingot of step 212 of flowchart 200 is machined to form an EB-PVD ingot having a desired size.

As shown and discussed in relation to flowcharts 100 and 200 in FIGS. 1 and 2, indium oxide can be blended with either yttria, calcia, magnesia, lanthanum oxide, cerium oxide, praseodymium oxide, neodymium oxide, promethium oxide, samarium oxide, europium oxide, gadolinium oxide, terbium oxide, dysprosium oxide, holmium oxide, erbium oxide, thulium oxide, ytterbium oxide, or lutetium oxide to form a mechanical mixture. This mechanical mixture is combined with zirconia, hafnia, or a blend of zirconia and hafnia to co-stabilize the cubic and tetragonal phases of zirconia or hafnia. Stabilizing the zirconia or hafnia is necessary to prevent transformation to the stabilizer deficient monoclinic phase of zirconia or hafnia. This is especially important in thermal barrier coatings, since transformation to the monoclinic phase causes the thermal barrier coating to crack, spall, or split, exposing both the coating itself and the material underneath to further chemical and thermal attack. As a result, the embodiments of the invention in FIGS. 1 and 2 advantageously stabilize the tetragonal and cubic phases of zirconia and hafnia in thermal barrier coatings, which prevents the coating from splitting, spalling, or cracking. Thus, both the coating and the material underneath the coating are protected from chemical and thermal attacks.

In the embodiments of the invention shown and discussed in relation to flowcharts 100 and 200 in FIGS. 1 and 2, by co-stabilizing the zirconia or hafnia with an indate precursor that is resistant to chemical attack by common impurities in fuel such as sodium, sulfur, phosphorus, and especially vanadium, the impurities are unable to leach away the stabilizers from stabilizing the zirconia or hafnia. As a result, the zirconia or hafnia does not transform to the stabilizer deficient monoclinic phase when introduced to impurities. This is especially important in thermal barrier coatings, since transformation to the monoclinic phase causes the thermal barrier coating to crack, spall, or split, exposing both the coating itself and the material underneath the coating to further chemical and thermal attack. Indium oxide is a good stabilizer of zirconia and hafnia in thermal barrier coatings because it is resistant to chemical attack by common fuel impurities. Thus, the embodiments of the invention shown and discussed in relation to flowcharts 100 and 200 in FIGS. 1 and 2, advantageously provide a thermal barrier coating that is resistant to chemical attack by common fuel impurities, which prevents impurities from leaching away the stabilizers of zirconia and hafnia. Furthermore, this maintains the tetragonal and cubic phases of zirconia and hafnia, and prevents the thermal barrier coating from cracking, spalling, and splitting.

In the embodiments of the present invention shown and discussed in relation to flowcharts 100 and 200 in FIGS. 1 and 2, indium oxide is used as a co-stabilizer of zirconia or hafnia due to its resistance to chemical attacks. But indium oxide volatilizes at a lower temperature than zirconia and hafnia, so during air plasma sprayable ("APS") or electron beam physical vapor deposition ("EB-PVD") processes the indium oxide boils off, therefore, is not included in the coating. Thus, the indium oxide must be blended with another co-stabilizer of zirconia and hafnia to remain in the thermal coating after either an APS or EB-PVD process. Thus the embodiments of the invention in FIGS. 1 and 2 advantageously co-stabilize the zirconia or hafnia with indium oxide and another stabilizer, making the indium oxide less volatile and more likely to remain in the thermal barrier coating after an APS or EB-PVD process.

Thus, a corrosion resistant thermal barrier coating material has been described.

The invention claimed is:

1. A method for forming a corrosion resistant thermal barrier coating material, said method comprising steps of:

blending indium oxide with at least one indate forming oxide to form a mechanical mixture;

heating said mechanical mixture to form an indate precursor; and blending said indate precursor with an oxide selected from the group consisting of zirconia and hafnia and blends thereof to form a co-stabilized mixture for use in producing said corrosion resistant thermal barrier coating material.

2. The method of claim 1 further comprising a step of using a powder forming method to change said co-stabilized mixture into an un-fired precursor powder.

3. The method of claim 2 further comprising a step of heating said un-fired precursor powder to form an APS powder.

4. The method of claim 2 further comprising a step forming said un-fired precursor powder into an ingot of a desired shape.

5. The method of claim 2 further comprising a step forming said un-fired precursor powder into an ingot of a desired shape and heating said ingot to form an EB-PVD ingot.

6. The method of claim 1, wherein said at least one indate forming oxide is selected from the group consisting of lanthanum oxide, cerium oxide, praseodymium oxide, neodymium oxide, promethium oxide, samarium oxide, europium oxide, gadolinium oxide, terbium oxide, dysprosium oxide, holmium oxide, erbium oxide, thulium oxide, ytterbium oxide, lutetium oxide, magnesium oxide, calcium oxide, and yttrium oxide.

7. The method of claim 1, wherein a chemical composition of said co-stabilized mixture is $Zr_{1-x-y}In_xM_yO_z$.

8. The method of claim 7, wherein M is selected from the group consisting of calcia, magnesia, yttria, lanthanum oxide, cerium oxide, praseodymium oxide, neodymium oxide, promethium oxide, samarium oxide, europium oxide, gadolinium oxide, terbium oxide, dysprosium oxide, holmium oxide, erbium oxide, thulium oxide, ytterbium oxide, and lutetium oxide.

9. The method of claim 7, wherein x has a value between approximately 0.01 and approximately 0.20.

10. The method of claim 7, wherein y has a value between approximately 0.01 and 0.20.

11. The method of claim 7, wherein z has a value between approximately 1.6 and 2.4.

12. The method of claim 1, wherein said mechanical mixture is heated to a temperature between approximately 1150° C. and approximately 1400° C.

13. The method of claim 3, wherein said un-fired precursor powder is heated to a temperature between approximately 1150° C. and approximately 1650° C.

14. The method of claim 5, wherein said EB-PVD ingot is heated to a temperature between approximately 1150° C. and approximately 1650° C.

15. A method for forming a corrosion resistant thermal barrier coating material, said method comprising steps of:

forming an indate precursor from indium oxide and an indate forming oxide to recite an active, positive step and settle issues of indefiniteness; and blending said indate precursor and an oxide selected from the group consisting of zirconia, hafnia, and a blend of zirconia and hafnia to form a mixture for use in producing said corrosion resistant thermal barrier coating material.

16. The method of claim 15 further comprising steps of:
forming an un-fired precursor powder from said mixture; and
heating said un-fired precursor powder to form an APS powder.

17. The method of claim 15 further comprising steps of:
forming an un-fired precursor powder from said mixture;
forming said un-fired precursor powder into an ingot of a desired shape; and
heating said ingot to form an EB-PVD ingot.

18. The method of claim 15, wherein said indate forming oxide is selected from the group consisting of lanthanum oxide, cerium oxide, praseodymium oxide, neodymium oxide, promethium oxide, samarium oxide, europium oxide, gadolinium oxide, terbium oxide, dysprosium oxide, holmium oxide, erbium oxide, thulium oxide, ytterbium oxide, lutetium oxide, magnesium oxide, calcium oxide, and yttrium oxide.

* * * * *

UNITED STATES PATENT AND TRADEMARK OFFICE
CERTIFICATE OF CORRECTION

PATENT NO.        : 7,534,290 B2                                     Page 1 of 1
APPLICATION NO.   : 11/657855
DATED             : May 19, 2009
INVENTOR(S)       : Michael Hill It is certified that error appears in the above-identified patent and that said Letters Patent is hereby corrected as shown below:

Col. 6 in claim 15, lines 4-5, delete "to recite an active, positive step and settle issues of indefiniteness".

Signed and Sealed this

Thirtieth Day of June, 2009

JOHN DOLL
*Acting Director of the United States Patent and Trademark Office*